(12) United States Patent
Zhong

(10) Patent No.: US 11,547,015 B2
(45) Date of Patent: Jan. 3, 2023

(54) NOTEBOOK COOLER WITH PRESSURIZING FUNCTION

(71) Applicant: Xihua Zhong, Guangdong (CN)

(72) Inventor: Xihua Zhong, Guangdong (CN)

( * ) Notice: Subject to any disclaimer, the term of this patent is extended or adjusted under 35 U.S.C. 154(b) by 0 days.

(21) Appl. No.: 17/326,372

(22) Filed: May 21, 2021

(65) Prior Publication Data

US 2022/0377932 A1    Nov. 24, 2022

(51) Int. Cl.
*H05K 7/20*       (2006.01)
*G06F 1/20*       (2006.01)

(52) U.S. Cl.
CPC ......... *H05K 7/20136* (2013.01); *G06F 1/203* (2013.01)

(58) Field of Classification Search
CPC .......... F16J 15/02; F16J 15/022; F16J 15/064; F16J 2015/0862; H05K 7/20136; G06F 1/203
See application file for complete search history.

(56) References Cited

U.S. PATENT DOCUMENTS

| | | | | |
|---|---|---|---|---|
| 5,149,109 A * | 9/1992 | Jelinek | ................... | F16J 15/127 403/381 |
| 5,765,835 A * | 6/1998 | Johnson | ................... | H01P 1/042 333/248 |
| 6,243,263 B1 * | 6/2001 | Kitahara | ............... | H01L 23/467 165/122 |
| 8,926,414 B1 * | 1/2015 | Kirkpatrick | ............. | G06F 1/203 361/679.41 |
| 9,128,672 B1 * | 9/2015 | Loo | .......................... | G06F 1/206 |
| 9,395,773 B1 * | 7/2016 | Huang | .................... | G06F 1/203 |
| 11,092,986 B2 * | 8/2021 | North | .................... | G06F 1/1632 |
| D951,261 S * | 5/2022 | Zhou | ........................... | D14/447 |
| 2004/0075980 A1 * | 4/2004 | Park | ...................... | G06F 1/1632 361/679.43 |
| 2004/0123604 A1 * | 7/2004 | Pokharna | ............... | G06F 1/1632 62/3.2 |
| 2004/0228085 A1 * | 11/2004 | Chen | ...................... | G06F 1/203 361/679.47 |
| 2008/0253075 A1 * | 10/2008 | Haglund | ................. | G06F 1/203 361/688 |
| 2009/0009442 A1 * | 1/2009 | Galbraith, Jr. | ....... | G02B 6/0023 345/83 |

(Continued)

OTHER PUBLICATIONS

Rosewill, RWNB17B 17Inches RGB Gaming Laptop Cooler with Big Quiet Fan. Adjustable color/Lighting/ Fan Speed Modes (Year: 2013).*

*Primary Examiner* — Michael A Matey

(57) ABSTRACT

A notebook cooler with a pressurizing function comprises a cooler body and one or more soft sealing elements detachably disposed on the cooler body. A notebook is placed on the soft sealing element, an airtight space is defined by the bottom of the notebook, the soft selling element and the cooler body, and a cooling fan is disposed in the airtight space. The circular soft sealing element is laid on the notebook cooler, so that an airtight space is defined by the bottom of the notebook, the soft sealing element and the cooler body; a turbofan sucks air from the bottom of the cooler and presses the air into the airtight space; and the cooler can press air into the notebook via cooling holes in the bottom of the notebook to effectively accelerate air circulation in the notebook, so that elements in the notebook can be rapidly cooled.

8 Claims, 6 Drawing Sheets

(56) References Cited

U.S. PATENT DOCUMENTS

| | | | | |
|---|---|---|---|---|
| 2009/0154089 A1* | 6/2009 | Seo | ............... | G06F 1/203 |
| | | | | 361/679.48 |
| 2010/0065258 A1* | 3/2010 | Blomquist | ............... | F28F 9/026 |
| | | | | 165/104.34 |
| 2010/0079945 A1* | 4/2010 | Wang | ............... | G06F 1/203 |
| | | | | 361/695 |
| 2010/0134976 A1* | 6/2010 | Kuo | ............... | G06F 1/1632 |
| | | | | 361/695 |
| 2010/0186928 A1* | 7/2010 | Chen | ............... | G06F 1/203 |
| | | | | 165/67 |
| 2010/0226088 A1* | 9/2010 | Huang | ............... | G06F 1/203 |
| | | | | 361/679.48 |
| 2010/0288902 A1* | 11/2010 | Liu | ............... | G06F 1/203 |
| | | | | 248/349.1 |
| 2017/0016539 A1* | 1/2017 | Sabotta | ............... | F16J 15/064 |
| 2017/0168531 A1* | 6/2017 | Casparian | ............... | G06F 1/206 |
| 2021/0191461 A1* | 6/2021 | Jaggers | ............... | G06F 1/1632 |
| 2022/0050514 A1* | 2/2022 | Yoon | ............... | H05K 7/20172 |

* cited by examiner

NOTEBOOK COOLER WITH PRESSURIZING FUNCTION

BACKGROUND OF THE INVENTION

The invention relates to the technical field of coolers, in particular to a notebook cooler with a pressurizing function.

Notebooks are designed to meet the requirement for portable mobile use and are becoming be more compact in structure and lighter and thinner in appearance with the rapid development of science and technology. High-performance notebooks commonly have the problems of excessively high temperature of the CPU and unsatisfying cooling effect when running large software. Notebook cooling is always a problem that cannot be neglected during long-term use of the notebooks. An excessively high temperature caused by poor cooling not only affects the operating experience, but also causes active frequency decrease of the CPU for the purpose of protecting the CPU against damage, which will compromise the performance of the notebooks. So, an external auxiliary device is needed to cool the notebooks sufficiently.

Existing notebook coolers cool notebooks by blowing air to the bottom of the notebooks by means of a fan and realize the cooling purpose by accelerating air circulation at the bottom of the notebooks to decrease of the temperature of the shell. However, such as cooling method cannot effectively accelerate air circulation inside the notebooks, so the cooling effect is unremarkable, the temperature of elements in the notebooks can only be slightly decreased, and heat generated during operation of the notebooks cannot be dissipated in time, thus compromising the performance of the notebooks.

In view of the above defects, the existing notebook coolers need to be improved.

BRIEF SUMMARY OF THE INVENTION

To overcome the defects of the prior art, the invention provides a notebook cooler with a pressurizing function.

The technical solution of the invention is as follows:

A notebook cooler with a pressurizing function comprises a cooler body and one or more soft sealing elements detachably disposed on the cooler body, wherein a notebook is placed on the soft sealing element, an airtight space is defined by the bottom of the notebook, the soft sealing element and the cooler body, and a cooling fan is disposed in the airtight space.

According to the solution, the notebook cooler with a pressurizing function is characterized in that a circular limit edge extends upwards from the periphery of a top panel of the cooler body, and a bottom edge of an outer wall of the soft sealing element is attached to the limit edge.

According to the solution, the notebook cooler with a pressurizing function is characterized in that the soft sealing element comprises a first sealing element and a second sealing element embedded in the first sealing element.

According to the solution, the notebook cooler with a pressurizing function is characterized in that the first sealing element is circular, and the second sealing element is U-shaped.

According to the solution, the notebook cooler with a pressurizing function is characterized in that a protrusion is disposed on an inner wall of the first sealing element and has a side provided with an oblique portion and a side provided with an arc portion.

According to the solution, the notebook cooler with a pressurizing function is characterized in that bevels are disposed on inner sides of two arms of the second sealing element respectively and abut against the oblique portion.

According to the solution, the notebook cooler with a pressurizing function is characterized in that the soft sealing element is made of memory foam, soft plastic, or PVC soft rubber.

According to the solution, the notebook cooler with a pressurizing function is characterized in that detachable stop pieces are disposed on an upper shell of the cooler body, bent portions are disposed at tops of the stop pieces, and grains are disposed on two side of the bent portions.

According to the solution, the notebook cooler with a pressurizing function is characterized in that long legs and short legs are disposed on a lower shell of the cooler body and are hinged to the lower shell.

According to the solution, the notebook cooler with a pressurizing function is characterized in that an LED light strip is disposed between the upper shell and the lower shell of the cooler body in a surrounding manner.

According to the solution, the notebook cooler with a pressurizing function is characterized in that a light strip control key, a power jack and a speed control key are disposed on one side of the cooler body, and a plurality of USB expansion interfaces are disposed on the other side of the cooler body.

By adoption of the solution, the invention has the following beneficial effects: the circular soft sealing element is laid on the notebook cooler, and the periphery of the bottom of the notebook is closely attached to the soft sealing element, so that an airtight space is defined by the bottom of the notebook, the soft sealing element and the cooler body; a turbofan sucks air from the bottom of the cooler and then presses the air into the airtight space, so that pressured air will not leak; and the cooler can press air into the notebook via cooling holes in the bottom of the notebook to effectively accelerate air circulation in the notebook, so that elements in the notebook can be rapidly cooled.

BRIEF DESCRIPTION OF THE DRAWINGS

To more clearly explain the technical solutions of the embodiments of the invention, drawings used for describing the embodiments of the invention or the prior art will be briefly introduced below. Obviously, the drawings in the following description only illustrate some embodiments of the invention, and those ordinarily skilled in the art can obtain other drawings according to the following ones without creative labor.

Figure 1:
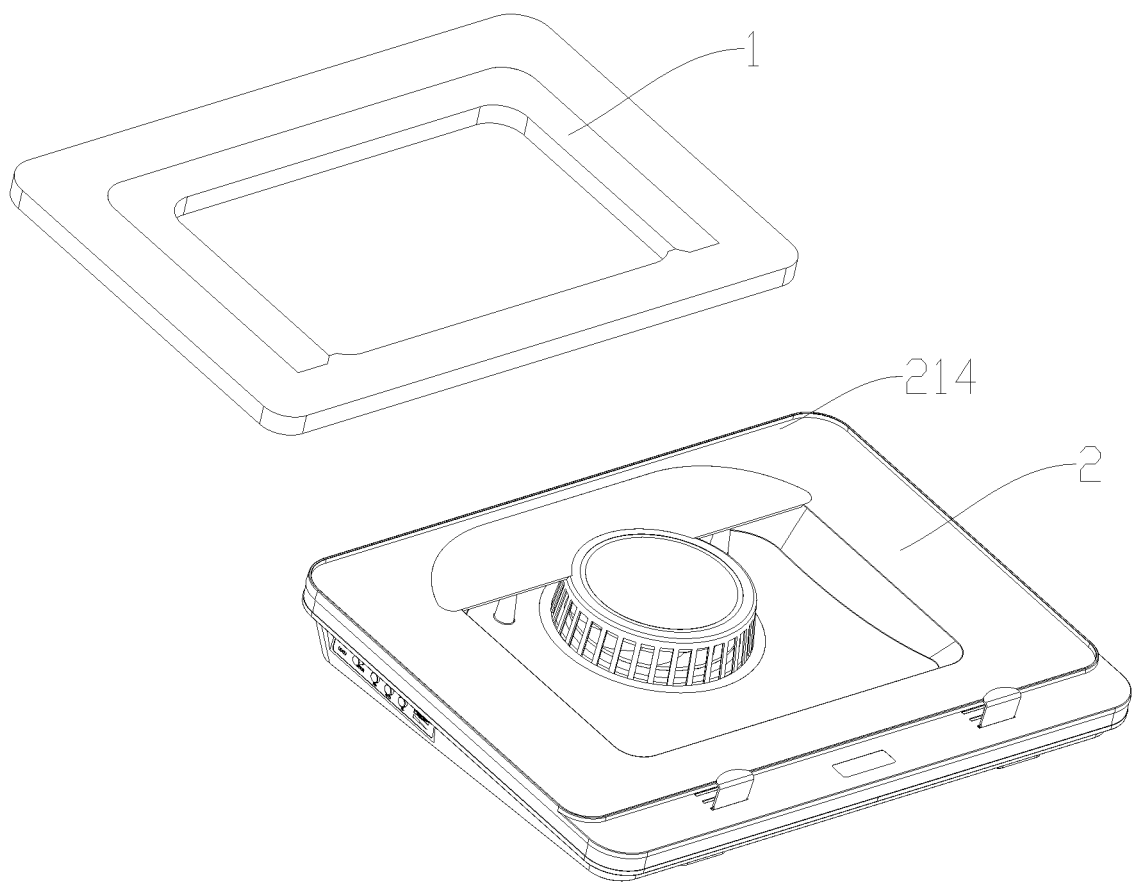
FIG. 1 is an exploded structural view of the invention.

REFERENCE SIGNS 1, soft sealing element; 11, first sealing element; 111, protrusion; 1111, oblique portion; 1112, arc portion; 12, second sealing element; 121, bevel;

2, cooler body; 21, upper shell; 211, fan housing; 212, cover plate; 213, stop piece; 2131, grain; 2132, bent portion; 214, limit edge; 22, lower shell; 221, dust screen; 222, long leg; 223, short leg; 224, non-slip mat; 23, LED light strip; 24, power jack; 25, light strip control key; 26, speed control key; 27, USB expansion interface.

DETAILED DESCRIPTION OF THE INVENTION

The invention will be further described below in conjunction with the accompanying drawings and embodiments.

It should be noted that when one element is "fixed" or "disposed" on the other element, it may directly or indirectly located on the other element. The terms such as "upper", "lower", "top", "bottom", "inner" and "outer" are used to indicate directions or positions based on the accompanying drawings merely for the purpose of facilitating the description, and should not be construed as limitations of the technical solutions of the invention. Terms such as "first" and "second" are merely for the purpose of facilitating the description, and should not be construed as indicating or implying relative importance or implicitly indicating the number of technical features referred to.

As shown in FIG. 1 to FIG. 9, a notebook cooler with a pressurizing function comprises a cooler body 2 and further comprises one or more soft sealing elements 1 detachably disposed on the cooler body 2, wherein a notebook is placed on the soft sealing element 1, an airtight space is defined by the bottom of the notebook, the soft sealing element 1 and the cooler body 2, and a cooling fan is disposed in the airtight space. In the invention, the cooling fan is a turbofan.

In the invention, the soft sealing element 1 is laid at the top of the cooler, the bottom of the notebook is closely attached to the soft sealing element 1, so that an airtight space is defined by the bottom of the notebook, the soft sealing element 1 and the cooler body 2; the turbofan is disposed in the cooler body 2, sucks air from the bottom of the cooler body 2 and then presses the air into the airtight space to generate an air pressure in the airtight space, and the air enters the notebook rapidly via cooling holes in the bottom of the notebook under the effect of the air pressure and is then discharged to take away heat in the notebook, so that elements in the notebook can be rapidly and effectively cooled, and the cooling efficiency is improved.

In one optional embodiment, a soft sealing element 1 is laid on an upper shell 21 of the cooler body 2. Specifically, a circular limit edge 214 extends upwards from the periphery of the upper shell 21 of the cooler body 2, and the bottom edge of an outer wall of the soft sealing element 1 is attached to the limit edge 214. The limit edge 214 has a certain depth and is exactly and perfectly attached to the bottom edge of the outer wall of the periphery of the soft sealing element 1. In this way, the notebook will not be affected by slipping of the sealing element when placed on the notebook cooler and can be used by users more easily.

Figure 2:
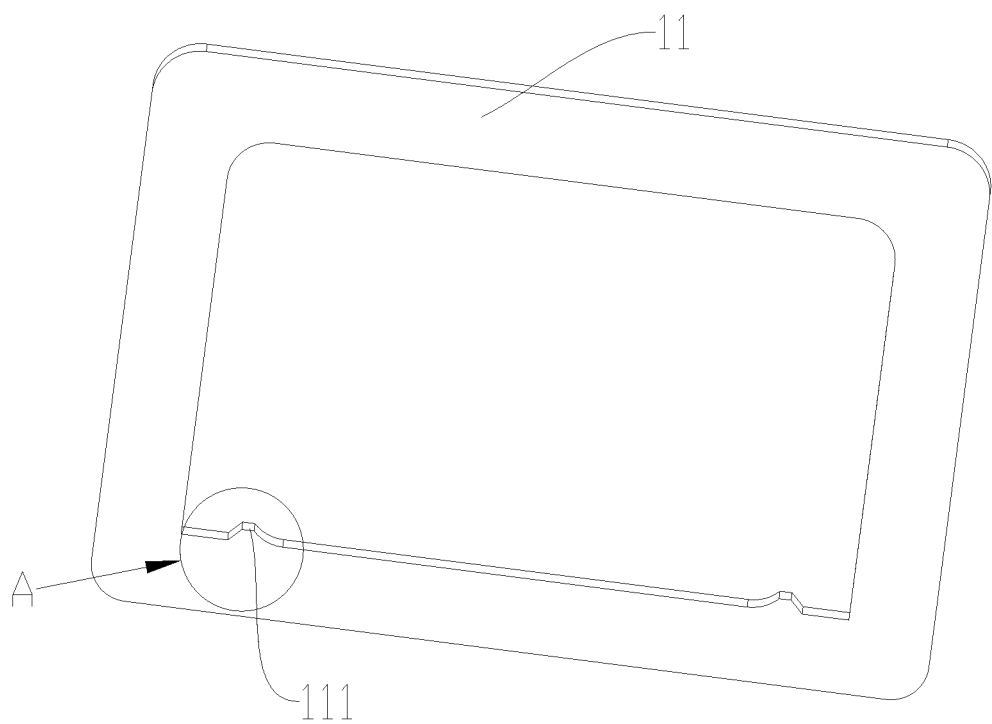
FIG. 2 is a structural diagram of a first sealing element of the invention.
Figure 3:
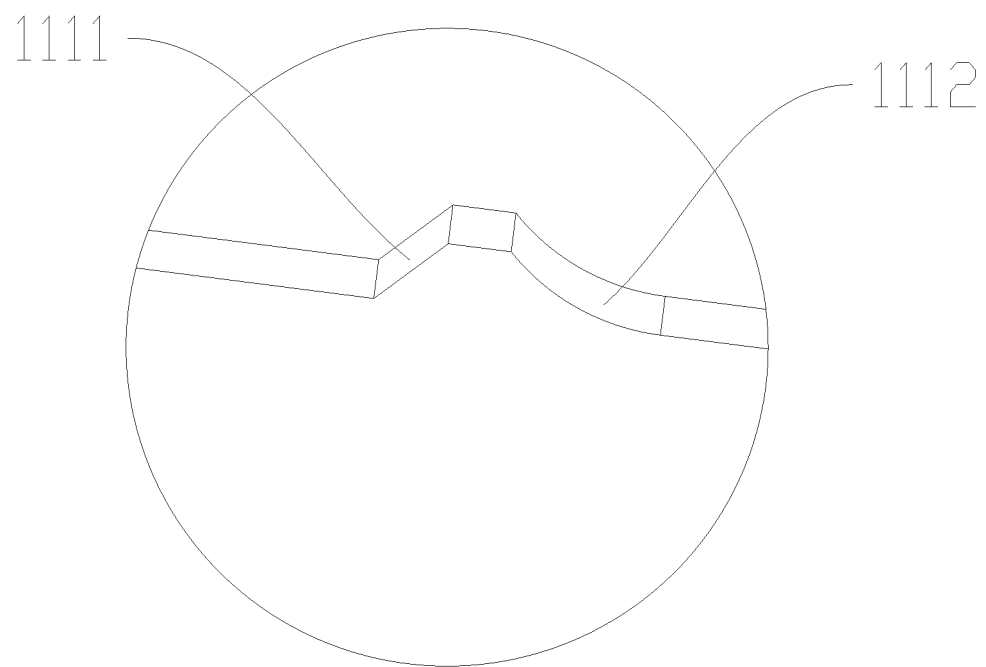
FIG. 3 is an enlarged view of part A in FIG. 2.
Figure 4:
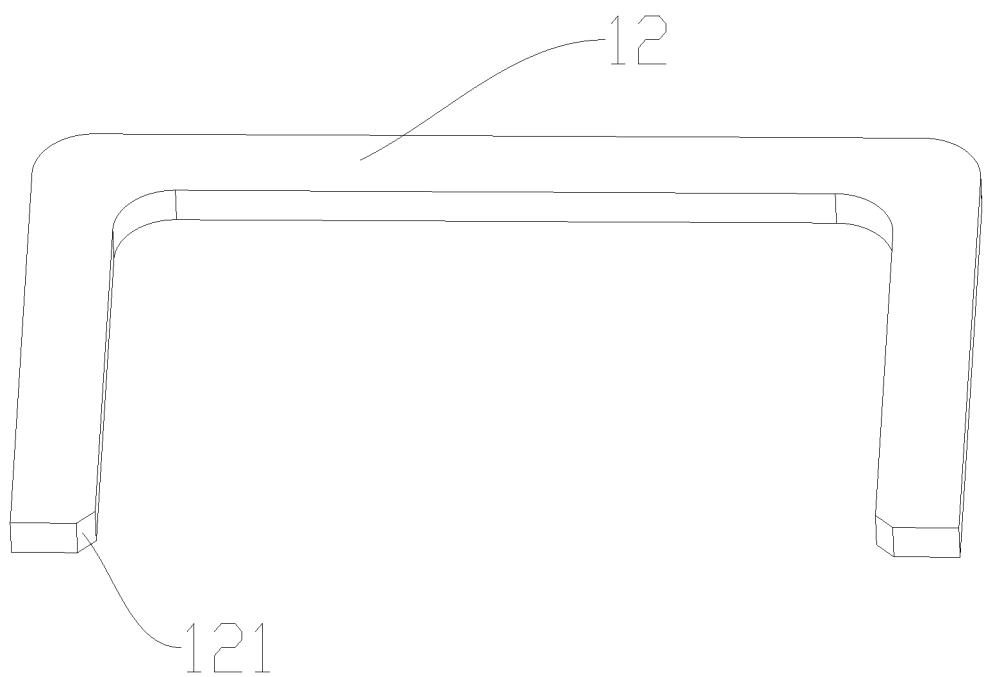
FIG. 4 is a structural view of a second sealing element of the invention.
Figure 5:
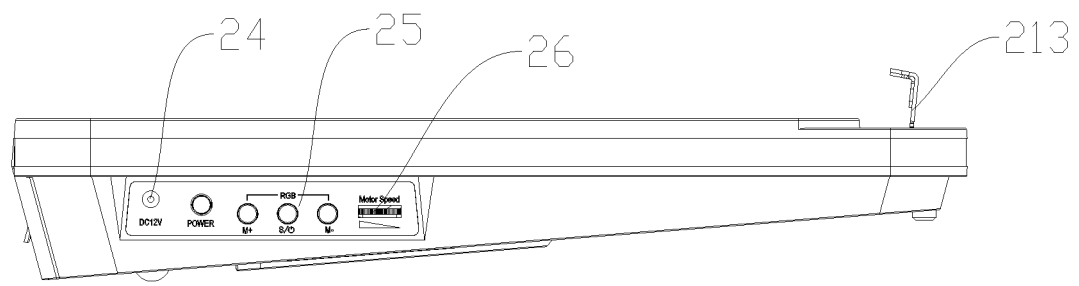
FIG. 5 is a side view of a cooler body of the invention.

As shown in FIG. 2 to FIG. 4, in one optional embodiment, the soft sealing element 1 comprises a first sealing element 11 and a second sealing element 12 embedded in the first sealing element 11. The notebook cooler with a pressurizing function is provided with the soft sealing element, and thus can be used for cooling notebooks of different sizes.

It is worth mentioning that a detachable combined soft sealing element 1 is disposed at the top of the cooler body 2. The soft sealing element 1 is one sealing element or a combination of sealing elements (two or more) to adapt to notebooks of different sizes.

In one optional embodiment, the first sealing element 11 is circular, and the second sealing element 12 is U-shaped.

In one optional embodiment, a protrusion 111 is disposed on one inner wall of the first sealing element 11, an oblique portion 1111 is disposed on one side of the protrusion 111, and an arc portion 1112 is disposed on the other side of the protrusion 111. To ensure that the second sealing element 12 is steadily embedded in the first sealing element 11, two protrusions 111 are symmetrically arranged on one inner wall of the first sealing element 11, in this embodiment.

In one optional embodiment, bevels 121 are disposed on inner sides of two arms of the second sealing element 12 and abut against the oblique portions 1111. One on hand, the protrusion 111 has a positioning function, so that users can rapidly embed the second sealing element 12 into the first sealing element 11; on the other hand, the bevels 121 abut against the oblique portions 1111, so that the first sealing element 11 and the second sealing element 12 can be attached more steadily and are not prone to being separated.

In one optional embodiment, the soft sealing element 1 is made of memory foam, soft plastic or PVC soft rubber. The soft sealing element 1 made of a soft material, such that the sealing performance is good, and the notebook placed on the soft material will not be scratched. The soft rubber is not limited to silicone, rubber, TPC, TPR, TPU and other materials in the prior art.

Figure 7:
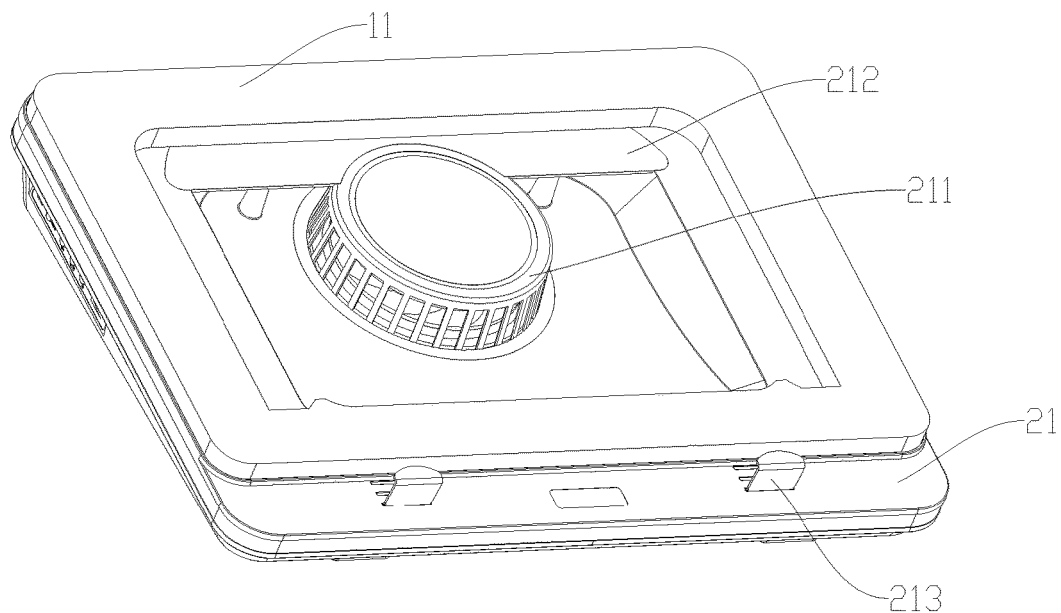
FIG. 7 is a state diagram of large-sized notebook cooling realized by the invention.

As shown in FIG. 7, in one embodiment where the notebook cooler with a pressurizing function is used for cooling a large-sized notebook, the second sealing element 12 on the first sealing element 11 is removed, the first sealing element 11 is disposed on the upper shell 21 of the cooler body 2 and is attached to the limit edge 214, and the large-sized notebook presses against the first sealing element 11 to be cooled.

Figure 8:
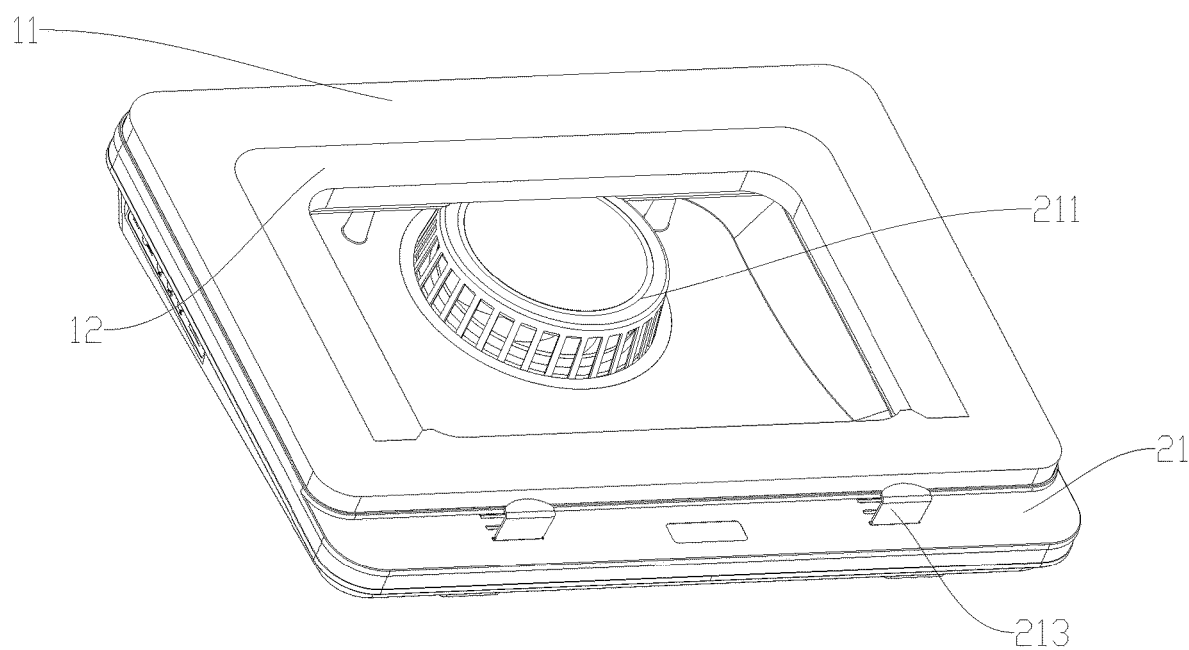
FIG. 8 is a state diagram of small-sized notebook cooling realized by the invention.
Figure 9:
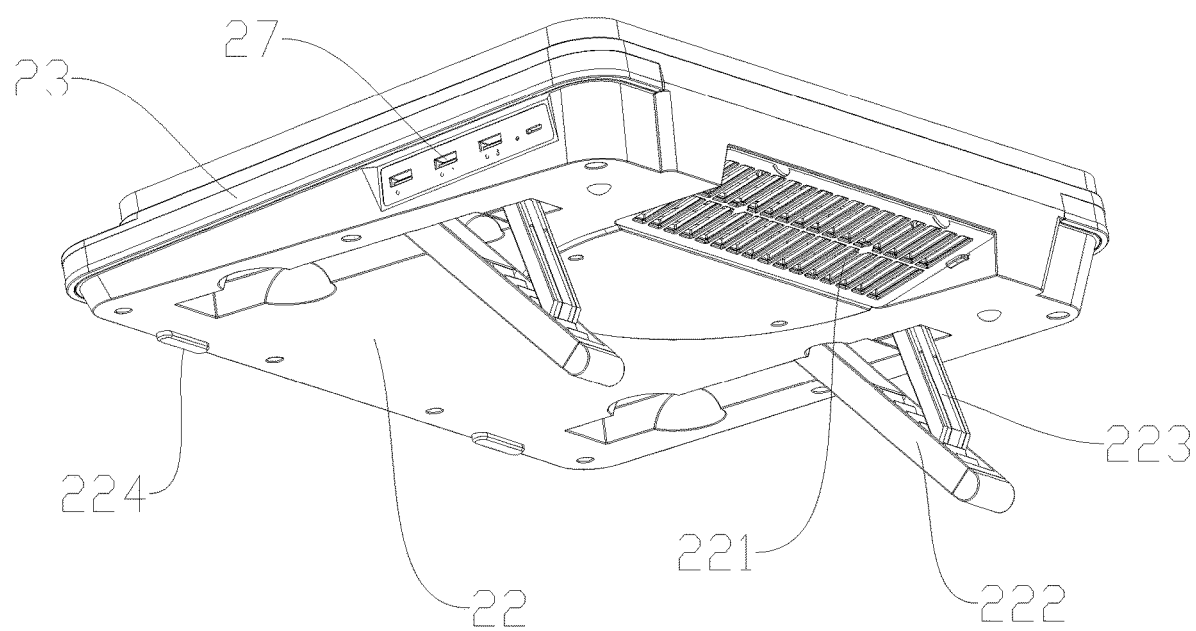
FIG. 9 is a state diagram of the inclination angle of an adjustable cooler of the invention.

As shown in FIG. 8, in another embodiment where the notebook cooler with a pressurizing function is used for cooling a small-sized notebook, the second sealing element 12 is embedded in the first sealing element 11, then the second sealing element 12 and the first sealing element 11 are integrally disposed on the upper shell 21 of the cooler body 2 and are attached to the limit edge 214, and the small-sized notebook presses against the second sealing element 12 to be cooled.

As shown in FIG. 5-FIG. 8, in one optional embodiment, the cooler body 2 comprises an upper shell 21 and a lower shell 22, wherein the upper shell 21 is fixed to the lower shell 22 and inclines by a certain angle, so that the notebook can be elevated by the cooler; and the notebook screen is inclined, so that pains of cervical vertebra and lumbar vertebra caused by long-term head-down for playing the notebook can be relieved.

In one optional embodiment, a turbofan is disposed in an accommodating cavity of the upper shell 21 of the cooler body 2, a fan housing 211 is fixed outside the turbofan, and a cover plate 212 extends out from one side of the fan housing 211. When a small-sized notebook is placed on the cooler, the cover plate 212 supports the second sealing element 12. The turbofan is disposed in the middle and sucks air from the outside to generate an air pressure in the airtight space, and the pressured air enters the notebook rapidly via cooling holes in the bottom of the notebook and is then discharged to take away heat in the notebook, so that the purpose of rapid cooling is realized.

Preferably, an air inlet is formed in the bottom of the cooler body 2, and a dust screen 221 is disposed at the air inlet and is used to filter out dust around the air inlet to prevent the dust from entering the notebook, so that dust accumulation in the notebook is reduced.

Figure 6:
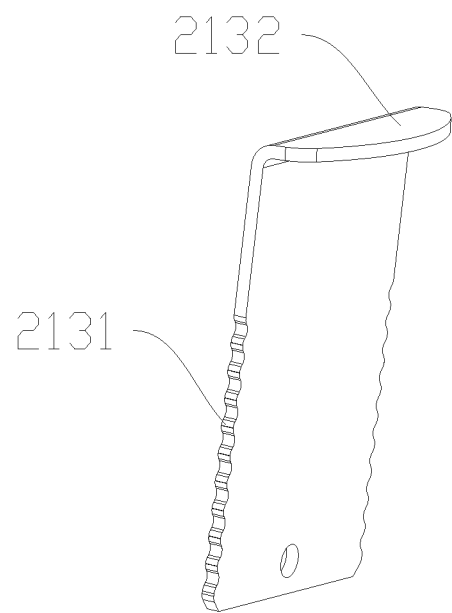
FIG. 6 is a structural diagram of a stop piece of the invention.

As shown in FIG. 6, in one optional embodiment, detachable stop pieces 213 are symmetrically disposed on the upper shell 21 of the cooler body 2 and can be inserted into a plurality of slots of the cooler body 2 to have their position and height being adjusted, and the stop pieces 213 can prevent the front end of the notebook from sliding down.

To facilitate position adjustment of the stop pieces 213, a plurality of slots are formed in an oblique front end of the cooler body 2; and to make the notebook cooler adapt to the size of the notebook, users can insert the stop pieces 213 into proper slots to enable the inner sides of the stop pieces abut against the front end of the notebook. Moreover, bent portions 2132 are disposed at the tops of the stop pieces and can clamp the front end of the notebook to ensure that the notebook is closely attached to the sealing element, so that the situation that the notebook cannot be closely attached to the sealing element and cannot be well sealed after the notebook screen is opened due to an extremely low weight of the front end of the notebook, and consequentially, the cooling effect is compromised is avoided.

To facilitate height adjustment of the stop pieces 213, grains 2131 are disposed on two sides of the stop pieces 213 and are clamped in the slots. The height of the stop pieces 213 can be adjusted according to the size of the notebook, so that the notebook can be steadily placed on the notebook cooler, and the airtightness of the airtight space is maintained.

As shown in FIG. 8, in one optional embodiment, long legs 222 and short legs 223 that can be folded are disposed on the lower shell 22 of the cooler body 2 and are hinged to the lower shell 22, and users can freely adjust the inclination angle of the notebook cooler by adjusting the long legs 222 and the short legs 223 in combination so as to change the height and angle of the notebook placed on the cooler. Specifically, the short legs 223 are rotated to be unfolded at first, and then the long legs 222 are rotated in the same direction to be unfolded until the bottoms of the short legs 223 lean against clamping sites of the long legs 222, so that the inclination of the cooler is adjusted. When the cooler is to be folded, the long legs 222 are folded at first, and then the short legs 223 are folded and are stacked on the long legs 222.

In one optional embodiment, a non-slip mat 224 is disposed at the bottom of the lower shell 22. The non-slip mat 224 is made of silicone, so that the friction between the non-slip mat and a placement surface is enlarged, and the anti-slip effect is realized.

In one optional embodiment, a power jack 24, a speed control key 26 and a light strip control key 25 are disposed on one side of the cooler body 2, and a plurality of different USB expansion interfaces 27 are disposed on the other side of the cooler body 2, so that users can select corresponding functions easily and can use the cooler more easily.

In one optional embodiment, an LED light strip 23 is disposed around the cooler body 2. The can LED light strip 23 decorate the cooler to enhance the atmosphere.

It should be understood that those ordinarily skilled in the art can make improvements or transformations according to the above description, and all these improvements or transformations should fall within the protection scope of the appended claims of the invention.

The invention is illustratively described above in conjunction with the accompanying drawings. Clearly, the implementation of the invention is not limited to the above embodiments. All improvements made based on the conception and technical solution of the invention, or direct application of the conception and technical solution of the invention to other occasions without any improvements should also fall within the protection scope of the invention.

What is claimed is:

1. A notebook cooler with a pressurizing function, comprising a cooler body, and further comprising one or more soft sealing elements detachably disposed on the cooler body, wherein a notebook is placed on the soft sealing element, an airtight space is defined by a bottom of the notebook, the soft sealing element and the cooler body, and a turbofan is disposed in the airtight space; the soft sealing element comprises a first sealing element and a second sealing element embedded in the first sealing element; a protrusion is disposed on an inner wall of the first sealing element and has a side provided with an oblique portion and a side provided with an arc portion.

2. The notebook cooler with a pressurizing function according to claim 1, wherein a circular limit edge extends upwards from a periphery of a top panel of the cooler body, and a bottom edge of an outer wall of the soft sealing element is attached into the circular limit edge.

3. The notebook cooler with a pressurizing function according to claim 1, wherein bevels are disposed on inner sides of two arms of the second sealing element respectively and abut against the oblique portion.

4. The notebook cooler with a pressurizing function according to claim 1, wherein the soft sealing element is made of memory foam, soft plastic, or PVC soft rubber.

5. The notebook cooler with a pressurizing function according to claim 1, wherein detachable stop pieces are symmetrically disposed on an upper shell of the cooler body, bent portions are disposed at tops of the stop pieces, and grains are disposed on two sides of the bent portions.

6. The notebook cooler with a pressurizing function according to claim 1, wherein long legs and short legs are disposed on a lower shell of the cooler body and are hinged to the lower shell.

7. The notebook cooler with a pressurizing function according to claim 1, wherein an LED light strip is disposed between an upper shell and a lower shell of the cooler body in a surrounding manner.

8. The notebook cooler with a pressurizing function according to claim 1, wherein a light strip control key, a power jack and a speed control key are disposed on a side of the cooler body, and a plurality of USB expansion interfaces are disposed on another side of the cooler body.

* * * * *